United States Patent [19]

Steele

[11] Patent Number: 5,450,608

[45] Date of Patent: Sep. 12, 1995

[54] PROGRAMMABLE LOGIC HAVING SELECTABLE OUTPUT STATES FOR INITIALIZATION AND RESETS ASYNCHRONOUSLY USING CONTROL BIT ASSOCIATED WITH EACH PRODUCT TERM

[75] Inventor: Randy C. Steele, Folsom, Calif.

[73] Assignee: Intel Corporation, Santa Clara, Calif.

[21] Appl. No.: 111,663

[22] Filed: Aug. 25, 1993

Related U.S. Application Data

[63] Continuation-in-part of Ser. No. 47,800, Apr. 15, 1993, abandoned.

[51] Int. Cl.$^6$ .............................................. G06F 9/00
[52] U.S. Cl. ............................. 395/800; 326/38; 326/39; 364/244.9; 364/DIG. 1
[58] Field of Search ............. 395/800, 750, 775; 307/465, 466, 468, 469, 530; 364/DIG. 1, DIG. 2; 326/40, 39; 365/185

[56] References Cited

U.S. PATENT DOCUMENTS

| | | | |
|---|---|---|---|
| 4,645,953 | 2/1987 | Wong | 307/466 |
| 4,851,720 | 7/1989 | Pathak et al. | 307/530 |
| 4,870,304 | 9/1989 | Blocker | 307/468 |
| 4,963,769 | 10/1990 | Hiltpold et al. | 365/185 |
| 5,155,389 | 10/1992 | Furtek | 326/39 |
| 5,247,213 | 9/1993 | Trinh et al. | 307/465 |
| 5,302,865 | 4/1994 | Steele et al. | 326/40 |
| 5,302,866 | 4/1994 | Chiang et al. | 326/40 |
| 5,345,112 | 9/1994 | Nazarian et al. | 307/443 |
| 5,357,153 | 10/1994 | Chiang et al. | 326/40 |
| 5,365,125 | 11/1994 | Goetting et al. | 326/39 |

OTHER PUBLICATIONS

Pathak et al; "A 20NS CMOS Programmable Logic Device for Asynchronous Applications"; IEEE 1988, pp. 15.1.1–15.1.4.

Frake et al; "A 9NS, Low Stanby Power CMOS PLD With a Single-Poly Eprom Cell" Feb. 17, 1989, IEEE International Solid State Circuit Conference.

*Primary Examiner*—Alyssa H. Bowler
*Assistant Examiner*—Meng-Ai T. An
*Attorney, Agent, or Firm*—Blakely, Sokoloff, Taylor & Zafman

[57] ABSTRACT

A programmable logic device having the capability of initializing and resetting to a specified digital state. One or more clear/preset product terms are available for initializing and resetting the macrocells of the programmable logic device. Each macrocell can be either cleared to a "0" or preset to a "1" according to the clear/preset product terms. Control bits are used to select which of the clear/preset product terms, if any, are to be used to clear and/or preset a particular macrocell. These control bits are programmable for each of the macrocells, thereby allowing each macrocell to output either a "0" or a "1", as desired by the user, independent of the other macrocells. The macrocells can be cleared and preset asynchronously.

6 Claims, 7 Drawing Sheets

PROGRAMMABLE LOGIC HAVING SELECTABLE OUTPUT STATES FOR INITIALIZATION AND RESETS ASYNCHRONOUSLY USING CONTROL BIT ASSOCIATED WITH EACH PRODUCT TERM

This application is a continuation-in-part of application Ser. No. 08/047,800, filed Apr. 15, 1993, now abandoned and entitled PROGRAMMABLE LOGIC HAVING SELECTABLE OUTPUT STATES FOR INITIALIZATION AND RESETS.

FIELD OF THE INVENTION

The present invention pertains to the field of programmable logic devices. More particularly, the present invention relates to an apparatus and method for allowing a particular digital state to be specified in a programmable logic device for initialization and reset operations.

BACKGROUND OF THE INVENTION

Circuit designers have at their disposal, a variety of different methods of implementing their circuit designs. One method involves incorporating their designs in dedicated custom integrated circuits (ICs). The initial cost is relatively high and the turn-around time for producing a first set of these semiconductor chips is relatively long. Another method involves the implementation of application-specific integrated circuits (ASICs). Time to market for ASICs are faster, and it is easier to implement design changes. A third alternative, which enjoys growing popularity, is utilizing programmable logic devices (PLDs).

A PLD is a semiconductor chip that contains an array of gates having programmable interconnections. The gates are programmed according to the specification provided by the circuit designer, thereby resulting in the desired logic functions. The programming usually involves using a piece of hardware, known as a programmer. A programmer is typically coupled by a serial port to a microcomputer, on which some form of programmer software is run. The simplest kind of software enables a designer to select which fuses to burn. The designer decides the desired logic function, at the gate level, then lists the corresponding fuses. Other more sophisticated programmers allow designers to specify Boolean expressions or truth tables. The software handles the minimization, simulation, and programming steps automatically. This yields custom combination and even sequential logic on a PLD chip.

There are basically two variants of PLDs: programmable array logic (PALs TM) and programmable logic arrays (PLAs). They are available in both bipolar and CMOS construction. PALs TM use fusible-link (one-time-programmable), whereas PLAs use floating-gate MOS (ultraviolet or electrically erasable). The differences between them are in respect to programming flexibility. PALs TM are typically faster, cheaper, and easier to program, but PLAs are more flexible. Programming of both types of devices is limited by their built-in structure.

In both cases, the desired logic functions are implemented by using standard product terms (p-terms). This involves first performing an AND function on the input variables and then forming the sum of the products, usually by performing an OR function. Typically, a standard number of p-terms are input to a programmable output structure, known as a macrocell.

Historically, when PLDs were first introduced, they tended to be simple and were rather limited in the functions that they could perform. Because of their limited resources, the early PLD designs typically could only be initialized to a given, predetermined state. For example, the PLD could be initialized to output all 0's or they could be initialized to output all 1's. Likewise, the PLDs could typically be reset to only the all 0's or all 1's state. Often, the PLD could only be reset synchronous to the system clock.

Now, with advances in semiconductor technology, PLDs have become bigger, and more complex. The functions of entire blocks of circuitry can be performed by a single PLD. Although modern PLDs are more powerful than their predecessors, some of the deficiencies associated with earlier PLD designs have, nonetheless, carried over into present day PLD designs. One of the deficiencies found in many modern PLD designs is that they cannot be initialized or reset to a user defined state. Typically, modern PLD designs only allow for initialization and resets to either the all 0's or all 1's state.

The disadvantage with this arrangement is that circuit designers wishing to use PLDs are constrained to initializing and resetting the PLD in a pre-determined state. It is not possible to have the PLD output a particular digital state other than all 0's or all 1's upon power-up. Under some circumstances, it would be beneficial, if not necessary, to have the PLD power-up in a particular user defined digital sequence other than all 0's or all 1's. Due to the constraint imposed by typical prior art PLDs, circuit designers must forgo using a PLD in their designs or must design around this limitation.

Once the PLD is up and running, a product term is typically implemented to provide an asynchronous reset. When the PLD is reset, it is typically reset to either the all 1's or all 0's state. Although a circuit designer has the flexibility to determine under what circumstances the PLD is to be reset by specifying the product term dedicated to the reset function, circuit designers often are not provided with the capability of specifying a particular digital state for output upon detecting a reset. This imposes a burden on circuit designers wishing to reset to a particular digital state. Again, circuit designers are forced to design around this contingency.

Thus, what is needed is an apparatus and method for providing a circuit designer with the flexibility of specifying a particular digital state to which a PLD is initialized. There is also a need in the prior art for extending that flexibility so that the PLD can be reset to any particular digital state. It would be highly preferable if both the initialization and resetting functions could be performed asynchronously.

SUMMARY OF THE INVENTION

The present invention pertains to a programmable logic device (PLD) having the capability of being initialized and reset to a specified digital state rather than being limited to the all 0's or all 1's cases. One or more clear/preset product terms are used to determine when the PLD is to be initialized or reset. When the PLD is initialized or reset, each of its macrocells can be programmed to output either a "1" or a "0", as specified by the user. In other words, each macrocell can be programmed independent of all the other macrocells. Control bits are associated with each macrocell. These control bits are implemented in order to select which of the clear/preset product terms, if any, are to be used to clear that particular macrocell and which are to be used to preset that macrocell. These control bits are programmable, thereby allowing a user to specify the output state for each macrocell when the PLD is initialized or reset. The control bits are stored within the PLD. Furthermore, the macrocells can be cleared and reset asynchronously.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A programmable logic device having an apparatus and method for selecting a particular output state corresponding to an initialization or reset operation is described. In the following description, for purposes of explanation, numerous specific details are set forth, such as control bits, output buffer configurations, product terms, etc., in order to provide a thorough understanding of the present invention. It will be obvious, however, to one skilled in the art that the present invention may be practiced without these specific details. In other instances, well-known structures and devices are shown in block diagram form in order to avoid unnecessarily obscuring the present invention.

Figure 1:
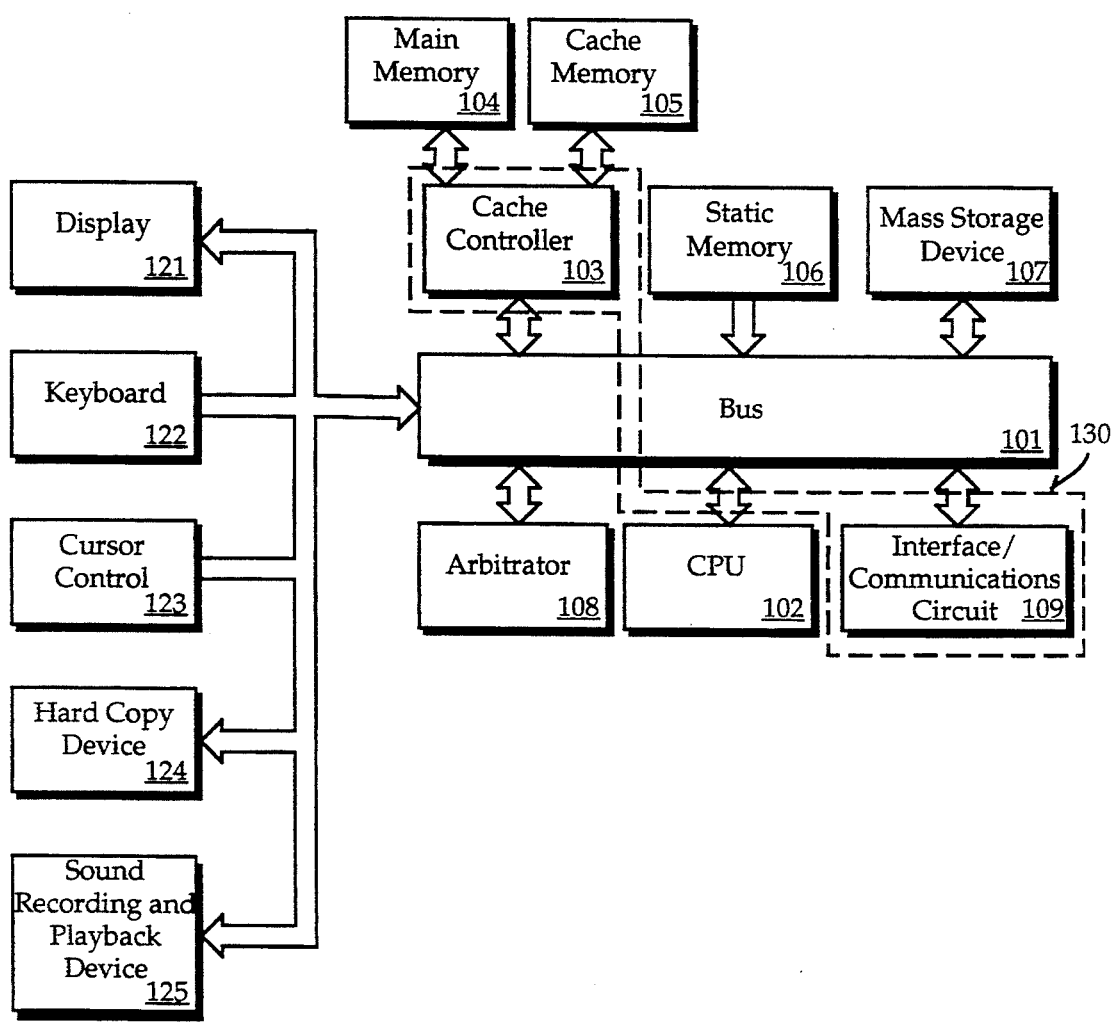
FIG. 1 illustrates a computer system upon which a PLD utilizing the present invention can be implemented.

Programmable logic devices can be implemented to perform various functions. For example, PLD's can be programmed to act as cache controllers, DRAM controllers, interface and/or communications devices, bus arbitrators, etc. Referring to FIG. 1, a computer system upon which a PLD utilizing the present invention can be implemented is shown. The computer system comprises a bus or other communication means 101 for communicating information. A central processing unit (usually a microprocessor) is used for processing information and is coupled onto bus 101. Furthermore, a number of co-processors 103 can be coupled onto bus 101 for additional processing power and speed. The computer system 100 further comprises a cache controller 103 coupled to bus 101 for accessing either the main memory 104 or cache memory 105. Main memory 104 is comprised of random access memory (RAM) or some other dynamic storage device which is used in storing information and instructions to be executed by CPU 102. Main memory 104 also may be used for storing temporary variables or other intermediate information during execution of instructions by CPU 102. The cache memory 105 comprises fast static random access memories (SRAMs) for temporarily storing the latest memory accesses.

The computer system also comprises a read only memory (ROM) and/or other static storage device 106 coupled to bus 101 for storing permanent information and instructions for processor 102. A data storage device 107 such as a hard, floppy, or optical disk drive can be coupled to bus 101 for storing information and instructions.

Also coupled to bus 101 are bus arbitrator 108 and interface/communications circuit 109. Bus arbitrator 108 is used to control the transmission and receipt of data on bus 101. Interface/communications circuit 109 is used to interface the computer system to another system, such as a computer network.

The computer system can be coupled to various devices. For example, a display device, 121, such as a cathode ray tube (CRT) can be coupled to bus 101 for displaying information to a computer user. An alphanumeric input device 122, including alphanumeric and other keys, may also be coupled to bus 101 for communicating information and command elections to processor 102. A cursor control 123 is coupled to bus 101 for communicating direction information and command selections to processor 102, and for controlling cursor movement on display 121. A cursor control device can include a mouse, trackball, joystick, touchpad, etc. This input device typically has two degrees of freedom in two axes, a first axis (e.g., x) and a second axis (e.g., y) which allows the device to specify any position in a plane.

As an example, the cache controller 103 and the interface/communications circuit 109 may be realized by a PLD implementing the present invention. Given a relatively large PLD and a simple cache controller and interface/communications circuit, a single PLD may suffice. This PLD is represented by the dashed line 130. PLD 130 accepts control signals over bus 101 from the CPU as well as from external sources. PLD 130 is programmed to provide the appropriate output signals to the state machines associated with cache controller 103 and interface/communications circuit 109 upon power-up or upon detection of a system interrupt.

This is performed according to a number of product terms, which are programmed into the PLD. As is described in greater detail below, some of the product terms are designated to specify the circumstances under which PLD 130 is to be either initialized or reset. By programming certain control bits, a particular output state can be specified upon initialization or reset of PLD 130. Thereby, the user has the option of specifying a desired output state for the state machines upon power-up, system interrupt, etc.

Figure 2:
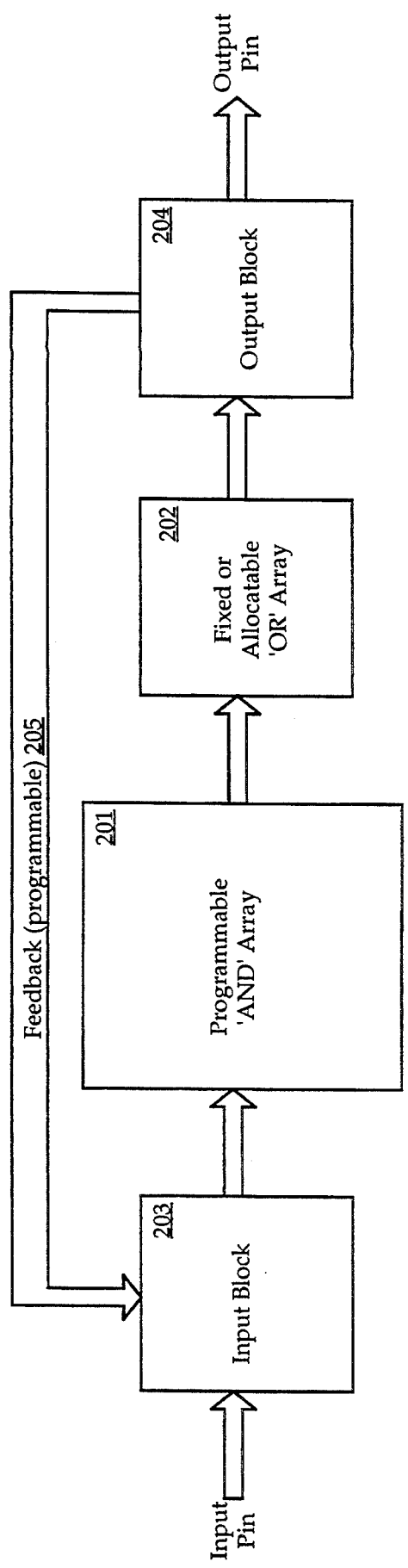
FIG. 2 is a block diagram of the general architecture of a PLD upon which the present invention may be practiced.

FIG. 2 is a block diagram of the general architecture of a PLD upon which the present invention may be practiced. The PLD is internally structured as a variation of the PLA architecture—an array of programmable AND gates 201 is coupled to a fixed or allocatable array of OR gates 202. PLDs make use of the fact that any logic equation can be converted to an equivalent sum-of-products (SOP) form. Hence, logic equations can be implemented in an AND/OR architecture. The basic PLA structure is augmented with input block 203 and output block 204. Input block 203 is comprised of latches and various programmable input options. Output block 204 is comprised of output controls, registers, etc. As described in detail below, the present invention is primarily implemented in an output block 204. According to the present invention, output block 204 is programmed such that it outputs a desired output state upon the detection of an initialization or reset of the PLD according to one or more product terms. In addition, programmable feedback 205 allows a user to implement sequential logic functions as well as combination logic.

The number and location of the programmable connections between the AND and OR matrices, along with the input and output blocks, are predetermined by the architecture of the PLD. The user specifies which of these connections are to remain open and which are to be closed, depending on the logic requirements. The PLD is programmed accordingly. Programmability of these connections can be achieved using various memory technologies such as fuses, EPROM cells, EEPROM cells, or static RAM cells. Typically, a user purchases a PLD off-the-shelf and by using a development system running on a personal computer, can produce a customized integrated circuit.

Figure 3:
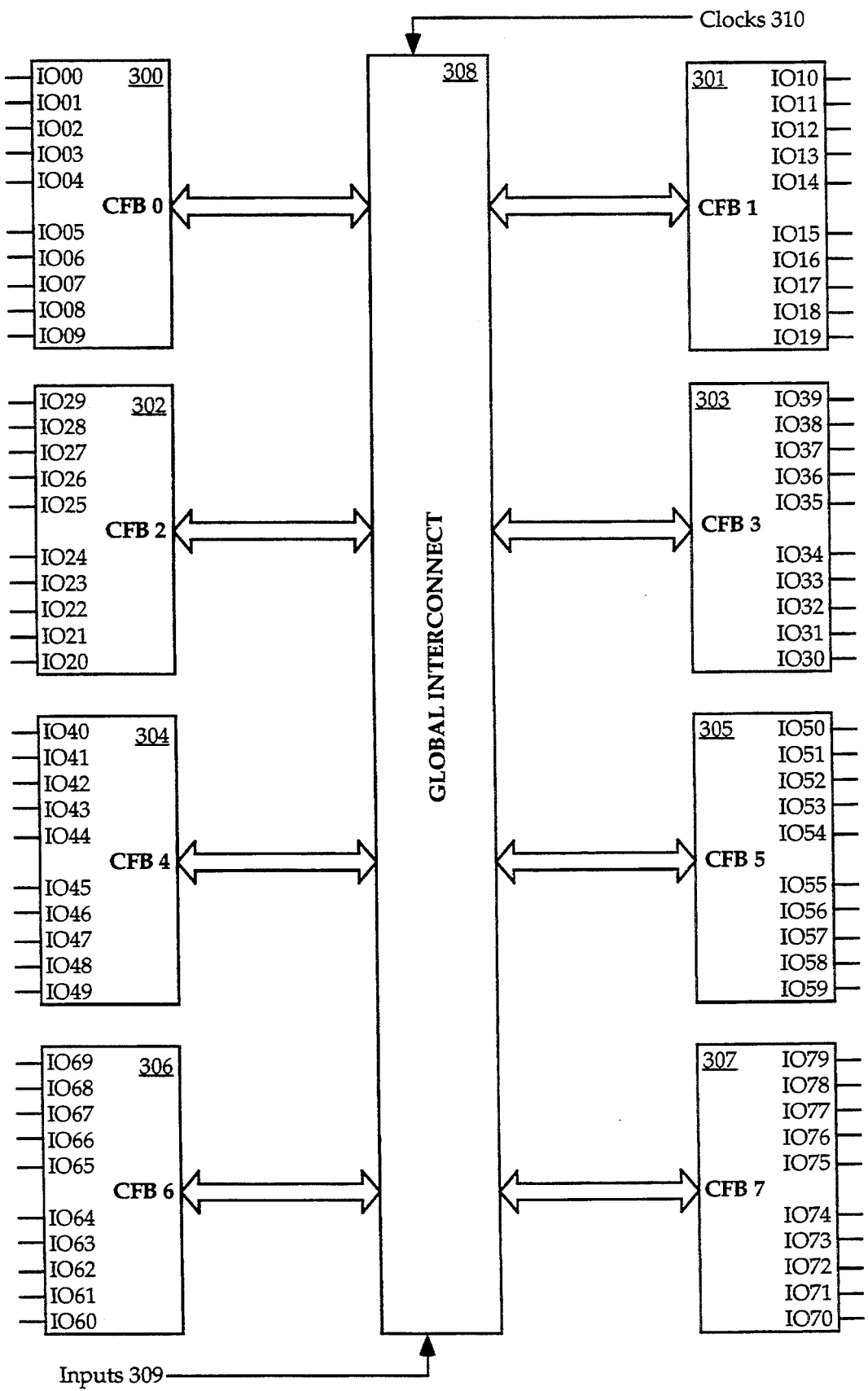
FIG. 3 is a block diagram illustrating a field programmable gate array (FPGA).

FIG. 3 is a block diagram illustrating a field programmable gate array (FPGA) upon which the present invention can be practiced. The FPGA is comprised of eight configurable function blocks (CFBs) 300–307 coupled together by a global interconnect 308. Each of the CFBs is similar to a PLA. Data 309 and clock 210 lines are input to CFBs 300–307 via global interconnect 308. Global interconnect 308 is a bus having an interconnecting matrix which renders each of the CFB blocks connectable. Any combination of signals in the matrix can be routed to any CFB block, up to the maximum fan-in of the block.

The CFBs 300–307 accept 24 bit wide inputs from global interconnect 308. Based on the inputs and the programmability up to ten outputs can be generated per CFB. In other words, 80 outputs IO00–IO79 can be generated by the eight CFBs 300–307. This type of device is known as a 24V10, where the "V" connotes variable programming.

The PLD is powered by a 5.0 supply voltage on the $V_{cc}$ pin. $V_{ss}$ is ground. In addition, in the currently preferred embodiment of the present invention, there is a separate $V_{cco}$ pin associated with each of the CFB's 300–307 (i.e., eight $V_{cco}$ pins). The $V_{cco}$ pins correspond to the output supply voltage. By coupling the desired output voltage to a $V_{cco}$ pin, a user can select the voltage level of signals being output from a particular CFB.

Figure 4:
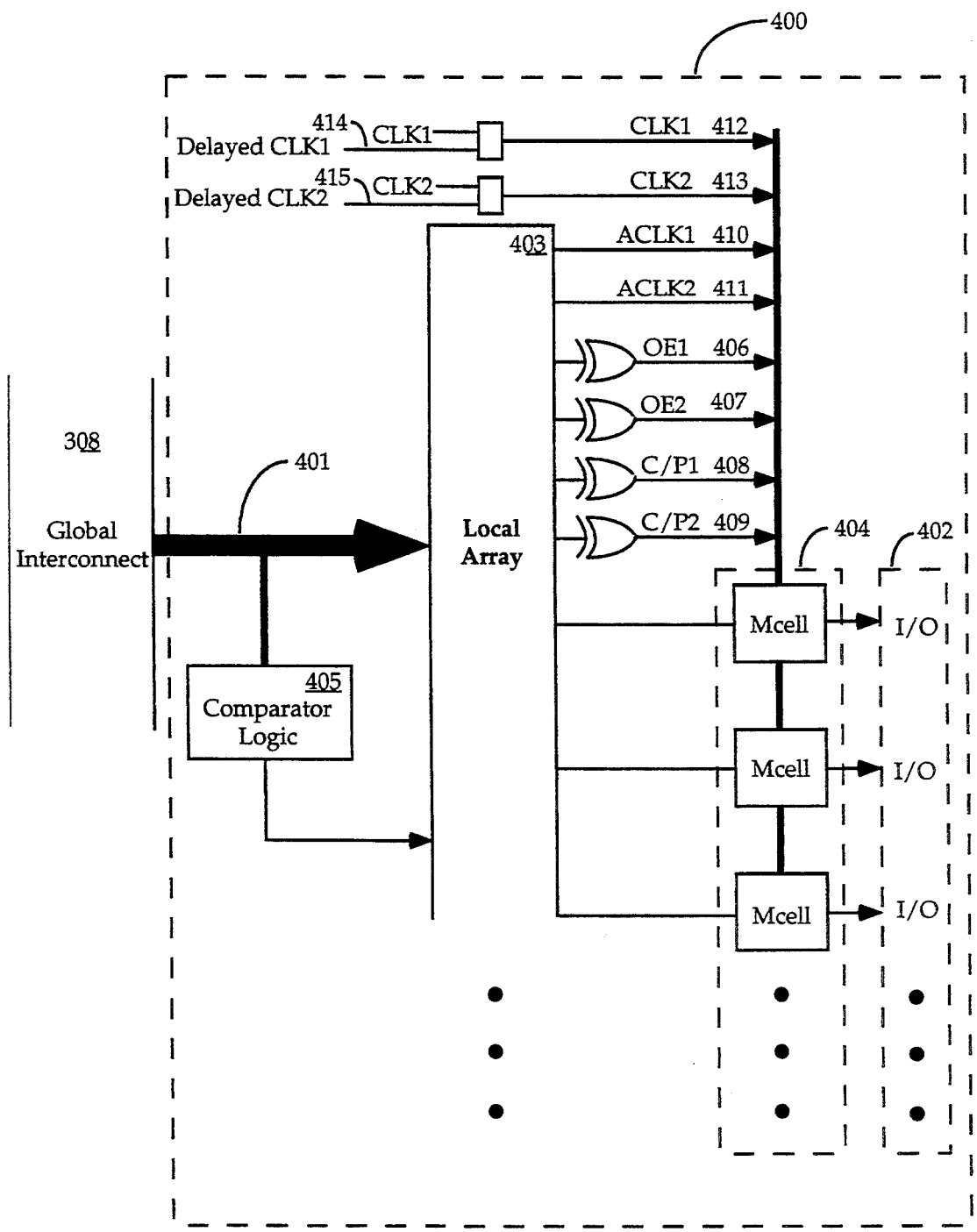
FIG. 4 is a block diagram illustrating a configurable function block

FIG. 4 is a block diagram illustrating a configurable function block 400. The CFB is comprised of a local array 403, ten programmable macrocells 404, comparator logic 405, four control signals 406–409, and four clock lines 410–413. There are 66 p-terms within a CFB. A user can program any combination of the 48 inputs (i.e., 24 inputs plus their complements) independently on all 66 of the p-terms. Six of the 66 p-terms are used as control and clock signals. Lines 406 and 407 provide two output enable signals to the macrocells. Lines 408–409 provide two product terms to each of the macrocells. These two p-terms, C/P1 and C/P2, are used to clear that particular macrocell (i.e., set the macrocell to a 0) or preset that macrocell (i.e., set the macrocell to a1).

The remaining 60 p-terms are distributed to the 10 outputs. Each output is driven by a macrocell. There are 10 macrocells in each CFB, one macrocell per output. Local array 403 is comprised of a programmable product term array and a p-term allocation circuit. The ten macrocells 404 can be programmed to function as an input as well as a combination, registered output, or bi-directional I/O. In the currently preferred embodiment, each CFB also has a programmable output polarity and programmable feedback options which allow greater flexibility in meeting target applications. The local array 403 and macrocells 404 will be described in detail below, especially in reference to the clear and preset functions.

Comparator logic 405 can perform an identity compare of up to 12 bits. The number of bits that can be compared is limited by the fan-in of the CFB. Since the current fan-in is 24 signals, a 12 bit comparator is implemented. When less than 12 bits are being compared, the remaining available signals can be used on other logic equations. For instance, an 8-bit compare leaves 8 other signals on the block fan-in (i.e., 24−16=8). The bits being compared may also be used to implement sum-of-product (SOP) logic in parallel with the compare function. The output of comparator logic 405 can be allocated in place of a p-term set in one of the macrocells 404. Additionally, the comparator logic 405 has an invert option, and the macrocell has an open drain output option. By using the macrocell/comparator inversion controls along with the open drain output option, a user can implement Compare/AND, Compare/OR, or Compare/AND/OR logic.

The four control signals 406–409 associated with each CFB is comprised of two Output Enable (OE) signals 406–407 and two asynchronous Clear/Preset (C/P) signals 408–409. It should be noted that although only two C/P p-terms are implemented in the currently preferred embodiment, any number of p-terms can be used to perform the Clear/Preset functions. Each control signal is generated by a single p-term from the local block AND array. Each control signal also has an inversion option.

There are three clocking options available for each macrocell 404: synchronous, delayed, and asynchronous. Synchronous clock lines 412 and 413 are the standard clock modes, wherein the register clock is driven directly from the device clock pins. Delayed mode is similar to the synchronous mode, except that there is a delay which is added to the clock signal at the block level. The delay can be added to one or both of the synchronous clocks as indicated by delayed clock lines 414 and 415. In the asynchronous mode, the register clock utilizes one of the two block-level single product term asynchronous clock signals. There are two asynchronous clock lines 410 and 411.

The two p-terms on lines 408 and 409 are both coupled to each of the macrocells 404. These two p-terms allow a user to specify under what two conditions a given macrocell is to be either cleared or preset. Three programmable control bits stored in the SRAM of the PLD are associated with each of the macrocells. These three control bits specify which of the two C/P terms control that particular macrocell and whether those p-terms cause that macrocell to be cleared (i.e., set to a 0) or preset (i.e., set to a 1). For example, a user can select a C/P1 p-term of A·B·C·D. Hence, whenever A·B·C·D is true, then that particular macrocell is either cleared to preset according to the three C/P control bits.

Figure 5:
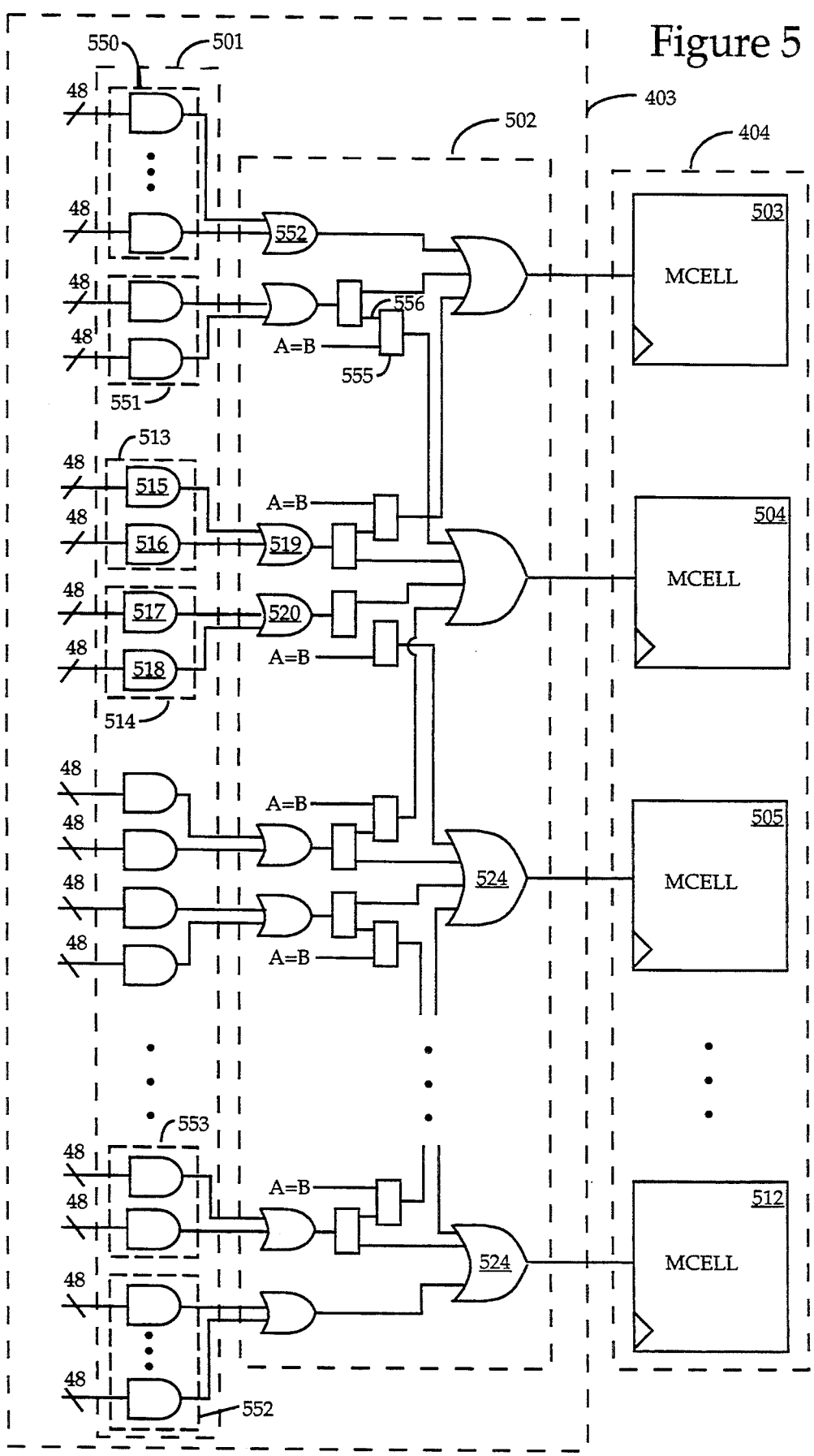
FIG. 5 is a block diagram illustrating the local array and ten macrocells.

FIG. 5 is a block diagram illustrating the local array 403 of FIG. 4 and ten macrocells 404. Local array 403 is comprised of a programmable AND array 501 followed by an OR array 402. A set of twelve product terms 550 and 552 are allocated and hardwired to the first and last macrocells 503 and 512. These macrocells are described in detail below in reference to FIG. 6. In addition, each of the two end macrocells also has a set of steerable product terms 551 and 553. There are two sets of steerable product terms associated with each of the middle eight macrocells. Each set has two product terms. For example, macrocell 504 has, by default, two sets of p-terms, sets 513 and 514. Set 513 is comprised of a p-term denoted by inputting 48 inputs to a first programmable AND gate 515 and a second p-term denoted by inputting 48 inputs to a second programmable AND gate 516. The 48 inputs originate from the 24 true and 24 complemented inputs from the global interconnect.

Each of the programmable AND gates allows a user to AND together any combination of the 48 inputs (e.g., input i AND input $\overline{4}$ AND input 7, etc.). Similarly, p-term set 514 includes two programmable 48-bit input AND gates 517 and 518. The outputs from each of the p-term sets are input to an OR gate. For example, the two outputs from AND gates 515 and 516 are input to OR gate 519. Likewise, the two outputs from AND gates 517 and 518 are input to OR gate 520. The product term allocation circuit uses multiplexers to steer each set to its associated macrocell or to an adjacent macrocell. Each multiplexer is controlled by a bit stored in SRAM. Consequently, each of the macrocells has the option of accepting unused product terms from adjacent macrocells on an as needed basis.

In an alternate embodiment, two SRAM bits could be used to allow the inputted p-term to be passed to either macrocell or both macrocells. Once the p-terms have been properly steered, they are routed through a fixed OR gate before being input to the macrocells. The fixed OR gate completes the sum-of-products (SOP) function.

In addition, there is also a second A=B multiplexer following each of the p-term steering multiplexers. Under the control of an additional SRAM bit, the A=B function may replace a p-term set in a given macrocell.

Figure 6:
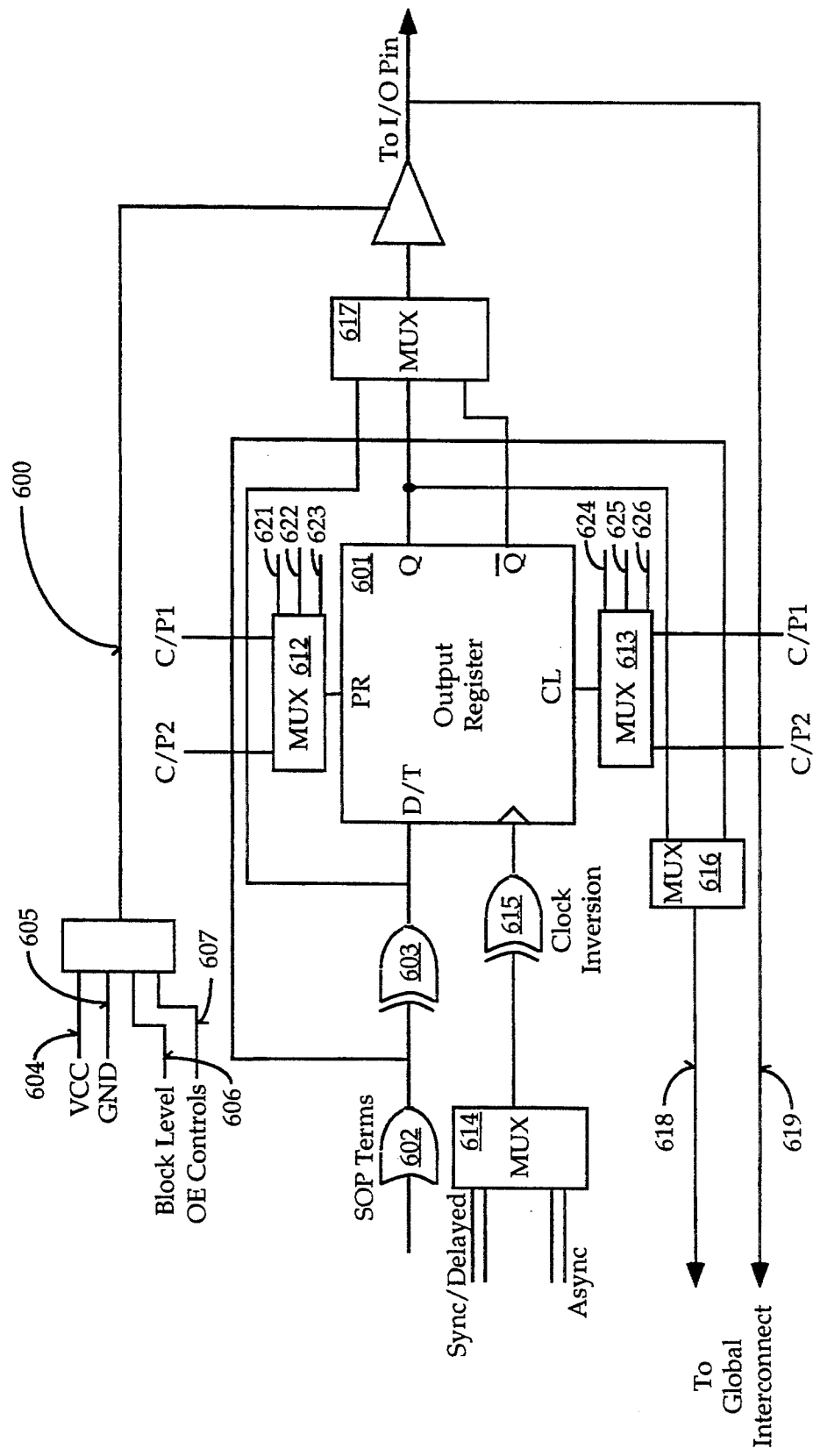
FIG. 6 is a block diagram illustrating a macrocell configuration.

FIG. 6 is a block diagram illustrating a macrocell 600 configuration such as may be implemented for any of the macrocells 503-512 shown in FIG. 5. Macrocell 600 is comprised of an output register 601 which can be configured as either a combinatorial block, a D-register, or a Toggle flip-flop. The SOP terms from the logic array are fed into OR gate 602 and passed through XOR gate 603 to the output register 601. Multiplier 617 selects whether to send the output from the XOR gate 603 or the Q or $\overline{Q}$ output from register 601 to output buffer 618. Output buffer 618 outputs the signal at the $V_{cco}$ voltage level for that CFB.

$V_{cc}$ (i.e., the supply voltage for the device) and ground lines 604–605 are provided for each macrocell. Furthermore, the block level output enable (OE) controls 606 and 607 specify three state buffering operations. The $V_{cc}$ option specifies an output operation, while the $V_{ss}$ option specifies an input operation.

Macrocell 600 has dual feedback paths 618 and 619 coupled back to the global interconnect. One feedback path 618 is internal, whereas the other feedback path 619 is coupled to an I/O pin. This feature allows I/O pins being used for buried logic to also be used as inputs. These I/Os may still be used to provide buried logic, since internal feedback is available. Multiplexer 616 selects whether to put the SOP terms or the Q output from register 601 onto internal feedback line 618.

Output register 601 is cleared or preset according to the two S p-terms: C/P1 and C/P2. Multiplexer 612 selects between whether the C/P1 p-term or the C/P2 p-term is used to preset macrocell 600. Similarly, multiplexer 613 selects whether the C/P1 p-term or the C/P2 p-term is used to clear macrocell 600. The three C/P control bits corresponding to macrocell 600, and stored in the SRAM of the PLD, are input to multiplexer 612 by lines 621–623. These three C/P control bits are used to control multiplexer 612. These same three C/P control bits are also input to multiplexer 613 via lines 624–626. They are used to control multiplexer 613.

If the three C/P control bits are 000, multiplexer 612 is disabled while multiplexer 613 selects the C/P1. In other words, macrocell 600 cannot be preset (i.e., set to a 1), while the C/P1 term causes macrocell 600 to be cleared (i.e., set to a 0). If the three C/P control bits are 001, multiplexer 612 selects the C/P2 term for presetting macrocell 600, and multiplexer 613 selects the C/P1 term for clearing macrocell 600. Setting the three C/P control bits to 010 causes the preset function to become disabled, while multiplexer 613 selects the C/P2 term on line 610 to clear macrocell 600. Setting the three C/P control bits to 011 causes the C/P1 term on line 609 to preset while the C/P2 term on line 610 clears macrocell 600.

A state of 100 for the three C/P control bits results in disabling both the preset and clear functions. If the C/P control bits are 101, the C/P1 term resets macrocell 600 while the clear function is disabled. For a state of 110, the C/P2 term presets macrocell 600, and the clear function is disabled. The 111 state is illegal. Table 1 below describes how the three C/P control bits operate to control the clearing and presetting of macrocell 600 by the two C/P p-terms.

TABLE 1

| C/P Control Bits | Preset | Clear |
| --- | --- | --- |
| 000 | None | C/P1 |
| 001 | C/P2 | C/P1 |
| 010 | N | C/P2 |
| 011 | C/P1 | C/P2 |
| 100 | None | None |
| 101 | C/P1 | None |
| 110 | C/P2 | None |
| 111 | Illegal | Illegal |

It should be noted that different states of the C/P control bits can be designated to correspond to controlling which of the C/P p-terms clears and presets the macrocell.

Multiplexer 614 selects which of the synchronous/-delayed or asynchronous clock is used to clock output register 601. The clocked output is fed into XOR gate 615 before being used as a clock input to output register 601. XOR gate 615 provides a clock invert option which allows output register 601 to be independently clocked on either the rising or falling edge of the global clock.

In the currently preferred embodiment, the PLD can be initialized and reset asynchronously. This means that the output from the PLD can occur independent of the system clock signal. In other words, the programmed output from the PLD occurs immediately upon detection of an initialization or reset, without having to wait for a transition of the system clock. Referring back to FIG. 6, the D/T input signal to macrocell 601 does not effect a change in the Q and $\overline{Q}$ outputs until the next rising edge of the clock signal occurs. This is not the case for the C/P1 and C/P2 signals. As soon as the C/P1 or C/P2 signals are asserted, they cause an immediate response in the Q and $\overline{Q}$ outputs. The clear and preset signals do not have to wait for a transition of the clock cycle to take effect (i.e., the clear and preset signals are asynchronous).

The following example illustrates how the currently preferred embodiment of the present invention selects for output the state for each of the macrocells. Suppose that the user wishes to output a 0101 from the first four macrocells whenever the condition A=1, B=1, C=1, and D=0 occurs. The user would program the C/P1 p-term to be responsive to that condition. In this example, the user would program the C/P1 term to be A·B·C·$\overline{D}$. The user also programs the three C/P control bits to be responsive to the C/P1 p-term for each of the macrocells to output the desired state. In this example, the first macrocell should output a 1 based on the C/P1 term. Hence, multiplexer 612 should be directed to select the C/P1 term. Consulting Table 1, this is accomplished by programming the C/P control bits to 101. Similarly, since the third macrocell is to output a 1, its C/P control bits are also programmed to be 101. In this example, the second and fourth macrocells should output a 0. In other words, the second and fourth multiplexers should be cleared according to the C/P1 p-term. Consulting Table 1, this is accomplished by setting the three C/P control bits associated with the second and fourth macrocells to 000. These control bits are stored in memory in the PLD. Note that in the present invention, each macrocell can be cleared or preset asynchronously.

Initially, the PLD is programmed according to a specification provided by a circuit designer. A piece of hardware, known as a programmer, is coupled to a microcomputer. A piece of software takes the specification and automatically determines which of the corresponding non-volatile memory bits are to be programmed to achieve the desired logic function. The software also performs minimization tasks, wherein complex logic equations are reduced to equivalent but more simplified equations and assigns the p-terms accordingly. It is this software which also programs the C/P control bits for each of the macrocells.

Figure 7:
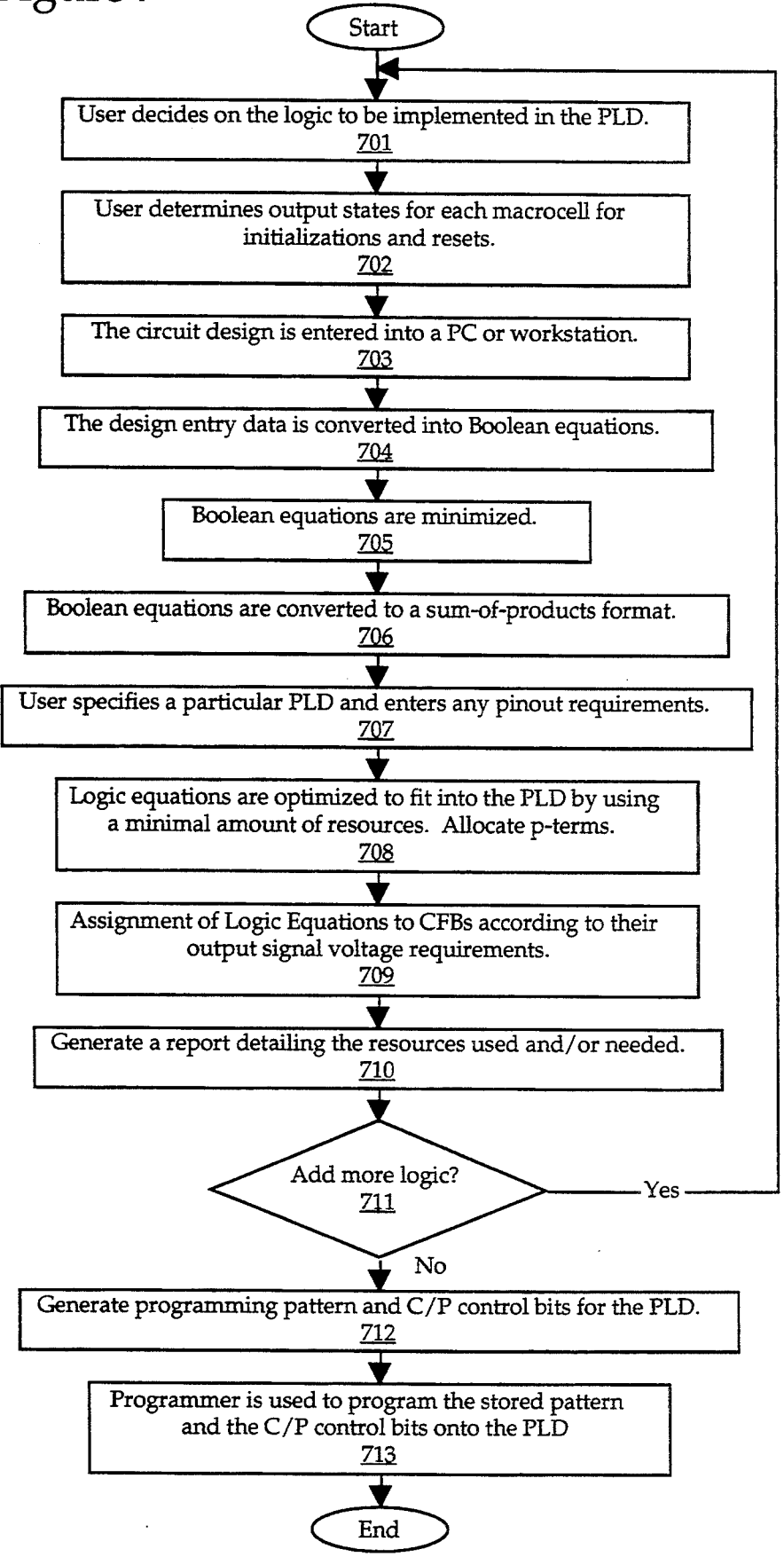
FIG. 7 is a flowchart illustrating the steps on a design process for PLDs.

FIG. 7 is a flowchart illustrating the steps on a design process for PLDs. First, the user decides on the desired logic to be implemented in the PLD, step 701. The user determines the output states for each macrocell for initializations and resets, step 702. The circuit design is entered into a personal computer or workstation, step 703. The design entry can be accomplished by the following methods: 1) schematic capture—a mouse or some other graphic input device is used to input schematics embodying the logic, 2) net list entry—a user enters the design to the computer by describing the symbols and interconnections in words via a standardized format (i.e., a net list), 3) state equation/diagram— entry of a sequential design involving states and transitions between states (equations or a state table can also be used to define a state machine), and 4) Boolean equations which involve expressing the logic in terms of Boolean algebraic equations.

Next, the software converts all design entry data into Boolean equations (if necessary), step 704. The Boolean equations are converted to a sum-of-products (SOP) format after logic reduction, steps 705 and 706. The logic is minimized through well-known heuristic algorithms. The user can specify the particular PLD for the design to be implemented and any pinout requirements, step 707. The software optimizes the logic equations to fit into the device, using the minimum amount of resources (e.g., I/O pins, registers, product terms, macrocells, etc.), step 708. This step allocates the p-terms accordingly. Logic equations are assigned to CFBs according to their output voltage signal requirements, step 709. A detailed report describing the resources used in fitting the design on the PLD is generated, step 710. This allows a user to incrementally implement additional logic if there is availability, step 711. In addition, if the design overflowed the PLD (i.e., the chosen PLD does not have the resources required to implement the design), a list of the resources needed to complete the design is generated. A user can choose a larger PLD or partition the initial design into two different PLDs. The appropriate program pattern for the PLD along with the C/P control bits are generated, step 712. A programmer is used to program the stored pattern and the C/P control bits onto the PLD, step 713.

Thus, a programmable logic device having the capability of being initialized or reset to a specified digital state is disclosed.

What is claimed is:

1. A programmable logic circuit comprising:
   a plurality of gates which can be programmed to implement a plurality of product terms, wherein an input signal is processed according to said product terms and a resulting output signal is generated;
   a plurality of registers coupled to said plurality of gates, each of said registers being independently cleared to a first potential or preset to a second potential greater than said first potential according to one of said plurality of product terms;
   a first multiplexer coupled to one register of said plurality of registers for selecting one of said plurality of product terms to determine when said register is to be cleared to said first potential of approximately 0 volts;
   a second multiplexer coupled to said one register of said plurality of registers for selecting one of said plurality of product terms to determine when said one register is to be preset to said second potential, wherein said one register is cleared and preset asynchronously; and
   a memory for storing at least one programmable control bit which controls how said first multiplexer and said second multiplexer selects between said plurality of product terms.

2. A programmable logic circuit comprising:
   a plurality of programmable gate means for implementing a plurality of product terms, wherein input signals are processed according to said plurality of product terms;
   a plurality of register means coupled to said plurality of programmable gate means for processing signals from said plurality of gate means, wherein each of said register means are independently cleared to a first potential or preset to a second potential greater than said first potential according to one of said plurality of product terms;
   a first multiplexer means coupled to one register means of said plurality of register means for selecting one of said plurality of product terms to determine when said one register means is to be cleared to said first potential of approximately 0 volts;
   a second multiplexer means coupled to said one register means of said plurality of register means for selecting one of said plurality of product terms to determine when said one register means is to be preset to said second potential, wherein said one register means is cleared and preset asynchronously; and a memory means for storing at least one programmable control bit means for controlling how said first multiplexer means and said second multiplexer means select between said plurality of product terms.

3. A computer system comprising:

a microprocessor for processing digital data;

a memory for storing digital data;

a bus for coupling said microprocessor to said memory;

a plurality of gates which can be programmed to implement a plurality of product terms, wherein an input signal is processed according to said product terms and a resulting output signal is generated coupled to said bus:

a plurality of registers coupled to said plurality of gates, each of said registers can be independently cleared to a first potential or preset to a second potential greater than said first potential according to one of said plurality of product terms;

a first multiplexer coupled to one register of said plurality of registers for selecting one of said plurality of product terms to determine when said register is to be cleared to said first potential of approximately zero volts:

a second multiplexer coupled to said one register for selecting one of said plurality of product terms to determine when said register is to be preset to said second potential, wherein said one register is cleared and preset asynchronously; and a memory for storing at least one programmable control bit which controls how said first multiplexer and said second multiplexer selects between said plurality of product terms.

4. A computer system comprising:

a processing means for processing digital data;

a memory means for storing said digital data;

a bus means for coupling said processor means to said memory means;

a plurality of programmable gate means for implementing a plurality of product terms, wherein input signals are processed according to said product terms coupled to said bus means;

a plurality of register means coupled to said plurality of gate means for processing signals from said plurality of gate means, wherein each of said register means can be independently cleared to a first potential or preset to a second potential greater than said first potential according to one of said plurality of product terms;

a first multiplexer means coupled to one register means of said plurality of register means for Selecting one of said plurality of product terms to determine when said one register means is to be cleared to said first potential of approximately 0 volts;

a second multiplexer coupled to said one register means for selecting one of said plurality of product terms to determine when said one register means is to be preset to said second potential, wherein said one register means is cleared and preset asynchronously; and a memory means for storing at least one programmable control bit means for controlling how said first multiplexer means and said second multiplexer means selects between said plurality of product terms.

5. A method of programming a programmable logic circuit to output a predetermined output state when said programmable logic circuit is reset, said method comprising the steps of:

specifying a product term for resetting said programmable logic circuit:

programming said product term into said programmable logic circuit;

programming each register of said programmable logic circuit to output either a first potential or a second potential in accordance with said predetermined output state by using a plurality of multiplexers to clear or preset each of said register upon detection of an input signal according to said programmable logic circuit, wherein each of said registers provides an output asynchronous to a clock signal used to clock said programmable logic circuit upon detecting said reset; and storing a control bit for each of said registers, said control bit selecting between said first potential and said second potential for output upon detection of reset of said programmable logic circuit.

6. A method of initializing a programmable logic circuit to a pre-determined output state, said method comprising the steps of:

detecting an input signal according to a product term programmed into said programmable logic circuit for initializing said programmable logic circuit;

utilizing a plurality of multiplexers to determine whether each macrocell of said programmable logic circuit is to output a first potential or a second potential upon detection of an initialization of said programmable logic circuit;

each macrocell outputting either said first potential or said second potential when said macrocell is initialized according to said product term, wherein a combination of outputs from each macrocell results in said predetermined output state, wherein outputs from each macrocell upon detection of initialization are asynchronous to a clock signal clocking said programmable logic circuit;

storing a control bit for each macrocell, said control bit determining whether said macrocell outputs said first potential or said second potential upon detection of said initialization; and programming a plurality of control bits for said programmable logic circuit.

* * * * *

UNITED STATES PATENT AND TRADEMARK OFFICE
CERTIFICATE OF CORRECTION

PATENT NO. : 5,450,608
DATED : September 12, 1995
INVENTOR(S) : Steele et al.

It is certified that error appears in the above-identified patent and that said Letters Patent is hereby corrected as shown below:

In column 2 at line 20 delete "modem" and insert --modern--

In column 6 at line 38 delete "docking" and insert --clocking--

In column 8 at line 49 delete "dears" and insert --clears--

In column 8 at line 54 delete "61S" and insert --615--

Signed and Sealed this

Eleventh Day of February, 1997

Attest:

BRUCE LEHMAN

Attesting Officer     Commissioner of Patents and Trademarks